(12) United States Patent
Sakamoto

(10) Patent No.: US 10,439,157 B2
(45) Date of Patent: Oct. 8, 2019

(54) DISPLAY DEVICE

(71) Applicant: Japan Display Inc., Minato-ku (JP)

(72) Inventor: Shigeru Sakamoto, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 16/143,685

(22) Filed: Sep. 27, 2018

(65) Prior Publication Data

US 2019/0097158 A1    Mar. 28, 2019

(30) Foreign Application Priority Data

Sep. 28, 2017    (JP) ................. 2017-187685

(51) Int. Cl.
| | | |
|---|---|---|
| *H01L 33/60* | (2010.01) | |
| *H01L 51/50* | (2006.01) | |
| *H01L 51/52* | (2006.01) | |
| *H01L 27/32* | (2006.01) | |
| *H01L 27/12* | (2006.01) | |

(52) U.S. Cl.
CPC ........ *H01L 51/5036* (2013.01); *H01L 27/124* (2013.01); *H01L 27/3258* (2013.01); *H01L 51/5206* (2013.01); *H01L 51/5221* (2013.01); *H01L 51/5271* (2013.01); *H01L 51/5056* (2013.01); *H01L 51/5072* (2013.01); *H01L 51/5092* (2013.01); *H01L 51/5096* (2013.01)

(58) Field of Classification Search
CPC combination set(s) only.
See application file for complete search history.

(56) References Cited

U.S. PATENT DOCUMENTS

2012/0243219 A1*  9/2012  Ohsawa .............. H01L 51/5265
                                             362/230
2012/0256208 A1* 10/2012  Hatano ................. H01L 51/504
                                             257/89

FOREIGN PATENT DOCUMENTS

JP      2008-218328        9/2008

* cited by examiner

*Primary Examiner* — Fernando L Toledo
*Assistant Examiner* — Valerie N Newton
(74) *Attorney, Agent, or Firm* — Oblon, McClelland, Maier & Neustadt, L.L.P.

(57) ABSTRACT

A display device includes an organic electroluminescence layer including a plurality of emission layers respectively emitting light of a plurality of colors, and a reflective layer configured to reflect the light emitted from the emission layers. A shortest optical path length between the emission layers and the reflective layer is longer than at least three times of a wavelength of blue light.

16 Claims, 11 Drawing Sheets

DISPLAY DEVICE

CROSS-REFERENCE TO RELATED APPLICATION

The present application claims priority from Japanese application JP2017-187685, filed on Sep. 28, 2017, the content of which is hereby incorporated by reference into this application.

BACKGROUND OF THE INVENTION

1. Field of the Invention

The present invention relates to a display device.

2. Description of the Related Art

In the related art, display devices including an organic electroluminescence layer including an emission layer are disclosed. In such a display device, light emitted from an emission layer is reflected by a reflective layer and discharged to the outside (for example, JP 2008-218328 A).

In a configuration using the reflective layer as described above, by adjusting thicknesses of vapor deposition layers stacked between the emission layer and the reflective layer to form the organic electroluminescence layer, optical interference is generated and luminous efficiency and color purity are improved. When optical interference is used as described above, the thicknesses of the vapor deposition layers need be respectively adjusted according to the wavelengths of colors of emitted light. When the vapor deposition layers are divided and vapor deposited according to the colors of the emitted light to adjust the thicknesses thereof, the number of manufacturing processes increases and the yield decreases, thereby increasing manufacturing costs.

SUMMARY OF THE INVENTION

An object of the present invention is to prevent an increase in the number of manufacturing processes and improve the yield.

A display device according to an embodiment of the present invention includes an organic electroluminescence layer including a plurality of emission layers respectively emitting light of a plurality of colors, and a reflective layer reflecting the light emitted from the plurality of emission layers. A shortest optical path length between the emission layers and the reflective layer is longer than at least three times of a shortest wavelength of a color among the plurality of colors of the emitted light.

DETAILED DESCRIPTION OF THE INVENTION

Figure 1:
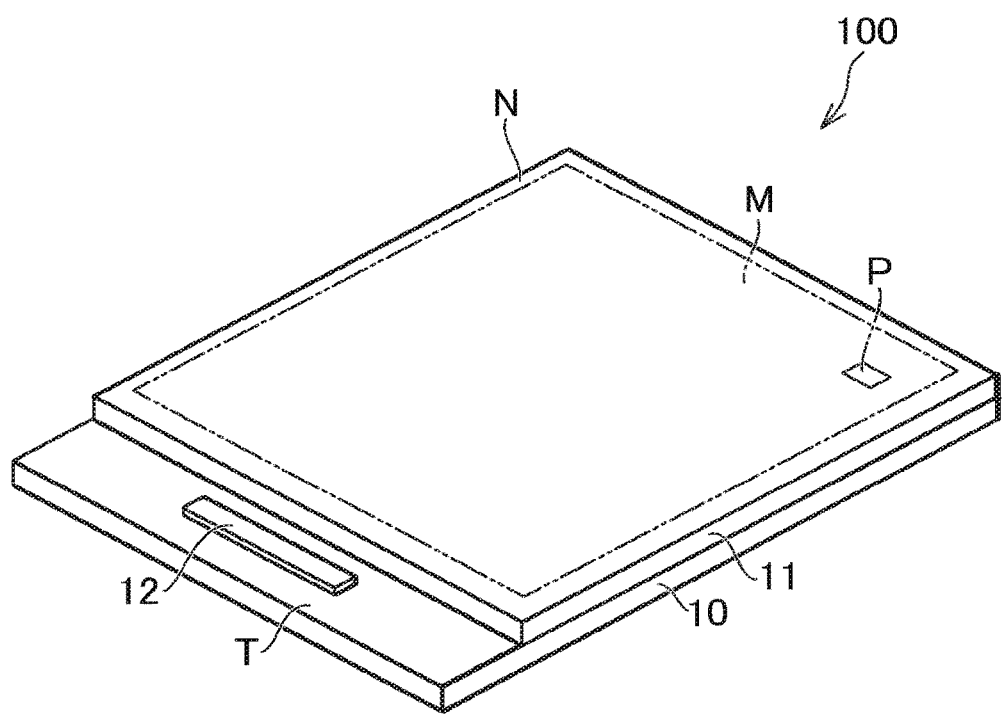
FIG. 1 is a perspective view illustrating an outline of an overall structure of a display device according to a first embodiment.

Hereinafter, embodiments of the present invention will be described with reference to the drawings. However, the present invention may be implemented in various forms without departing from the gist of the present invention and not be construed as being limited to the embodiments set forth herein.

For clarity, in the drawings, width, thickness, shape, and the like of each part may be schematically illustrated, when compared to an actual form thereof, but are merely examples and the present invention is not construed as being limited thereto. Same reference numerals are assigned to elements having same functions as those described and illustrated in the present specification and each drawing, and are not redundantly described herein.

Furthermore, the terms "on" and "below", when specifying the positional relation between a component and another component in an embodiment, are not limited to the case where the component is directly on or below the other component, but also includes the case where other components are interposed between these components unless mentioned otherwise.

FIG. 1 is a perspective view illustrating an outline of an overall structure of a display device according to a first embodiment. In the first embodiment, an organic electroluminescence display device is illustrated as an example of a display device 100. The display device 100 includes pixel regions P of a plurality of colors, for example, red, green, and blue, and is configured to display a full-color image. In the following description, reference numeral R representing a red pixel region, reference numeral G representing a green pixel region, or reference numeral B representing a blue pixel region is added to reference numeral P representing the pixel region when it is necessary to distinguish a color of a pixel region, but pixel region P is simply used when it is unnecessary to distinguish the color of a pixel region.

The display device 100 includes a first substrate 10 having a rectangular (for example, oblong) shape and a second substrate 11 arranged facing the first substrate 10. The first substrate 10 may be a rigid or flexible substrate, and be formed of glass, polyimide resin, polyethylene terephthalate, or the like. The first substrate 10 has a display region M, in which a plurality of pixel regions P are arranged in a matrix. Although only one pixel region P is illustrated in FIG. 1, the pixel regions P are arranged substantially over the entire display region M. The first substrate 10 further has a frame region N around the display region M. Furthermore, the first substrate 10 has a terminal region T, and an integrated circuit chip 12 configured to drive elements to display an image is mounted on the terminal region T. Although not illustrated, a flexible substrate may be electrically connected to the terminal region T. Alternatively, the second substrate 11 may be omitted.

Figure 2:
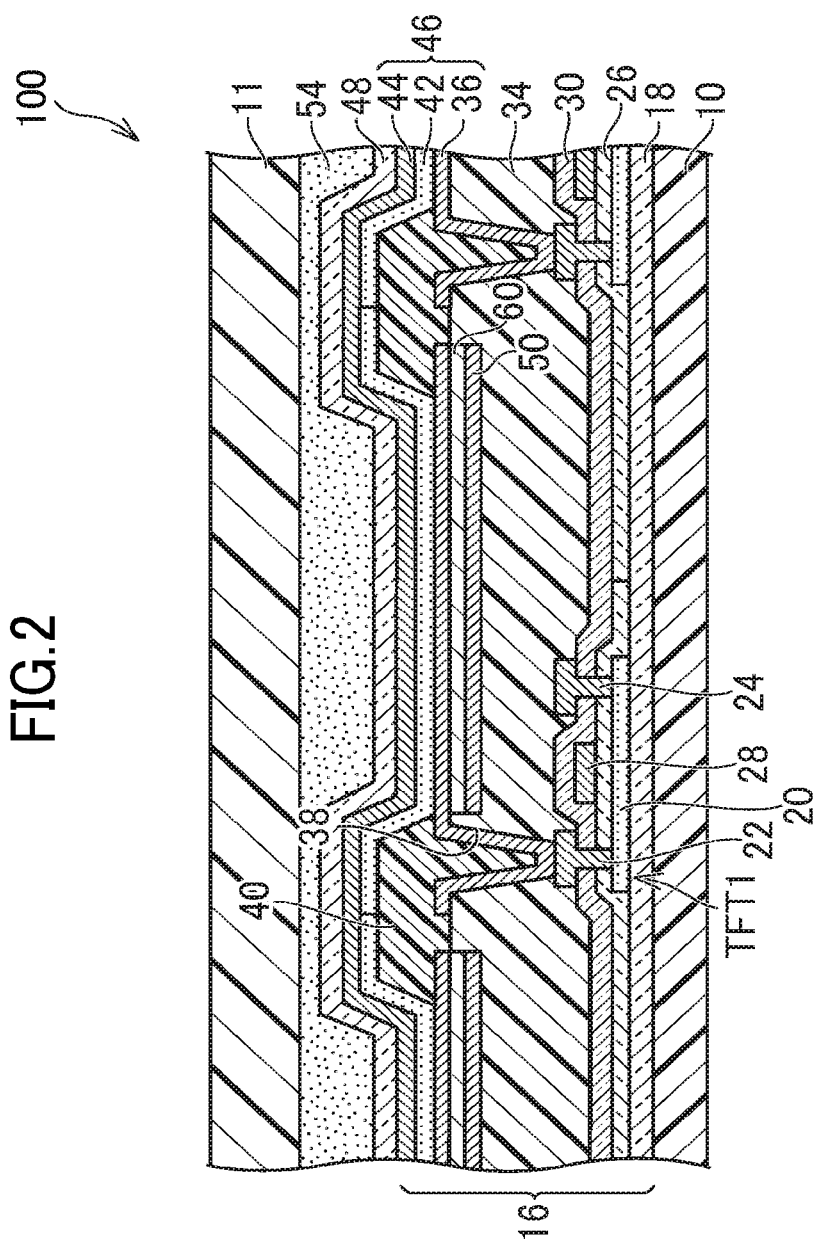
FIG. 2 is a cross-sectional view of the display device according to the first embodiment.

A stack structure of the display device 100 will be described in detail with reference to FIG. 2 below. FIG. 2 is a cross-sectional view of the display device according to the first embodiment. A display circuit layer 16 including a plurality of layers is stacked on the first substrate 10. The display circuit layer 16 includes an undercoat layer 18 serving as a barrier against impurities contained in the first substrate 10. The undercoat layer 18 may be formed of an inorganic material, such as a silicon oxide film, a silicon nitride film, or a stack structure thereof. A semiconductor layer 20 is formed on the undercoat layer 18. A source electrode 22 and a drain electrode 24 are electrically connected to the semiconductor layer 20, and a gate insulating film 26 is formed covering the semiconductor layer 20. Similarly, the gate insulating film 26 is formed of an inorganic material. A gate electrode 28 is formed on the gate insulating film 26, and an interlayer insulating film 30 is formed covering the gate electrode 28. The interlayer insulating film 30 is also formed of an inorganic material. The source electrode 22 and the drain electrode 24 penetrate the gate insulating film 26 and the interlayer insulating film 30. The semiconductor layer 20, the source electrode 22, the drain electrode 24, and the gate electrode 28 form at least a part of a driving transistor TFT (thin-film transistor) 1.

A planarization layer 34 is provided on the interlayer insulating film 30. A plurality of pixel electrodes 36 (for example, anodes) are provided on the planarization layer 34 to correspond to a plurality of pixel regions P respectively. The planarization layer 34 is formed to planarize at least a plane on which the pixel electrode 36 is to be formed. The planarization layer 34 is preferably formed of an organic material such as photosensitive acrylic resin. The pixel electrode 36 is electrically connected to one of the source electrode 22 and the drain electrode 24 provided on the semiconductor layer 20 via a contact hole 38 penetrating the planarization layer 34 and a passivation film 32.

An insulating layer (bank) 40 partitioning the plurality of pixel regions P is formed on the planarization layer 34 and the pixel electrode 36. The insulating layer 40 is formed covering respective ends of the pixel electrodes 36 in adjacent pixel regions P.

An organic electroluminescence layer 42 is provided on the pixel electrode 36 and the insulating layer 40. A common electrode 44 (for example, a cathode) is provided on the organic electroluminescence layer 42. The common electrode 44 is positioned continuously on adjacent pixel electrodes 36. The organic electroluminescence layer 42 is sandwiched between the pixel electrode 36 and the common electrode 44, and the brightness thereof is controlled by current flowing between the pixel electrode 36 and the common electrode 44 to emit light.

The organic electroluminescence layer 42 includes at least an emission layer 70 (see FIG. 3), and may include a hole transport layer, a hole injection layer, an electron transport layer, an electron injection layer, and the like. The pixel electrode 36, the organic electroluminescence layer 42, and the common electrode 44 form at least a part of a light-emitting element 46. The emission layer 70 is provided separately (discretely) for each of the pixel electrode 36. Light is emitted from a region in which the pixel electrode 36, the organic electroluminescence layer 42, and the common electrode 44 are sequentially stacked in contact with each other. This region will be referred to as a light-emitting part. The light-emitting part emits blue, red or green light corresponding to each of the pixel regions P. Colors respectively corresponding to the pixel regions P are not limited thereto, and, for example, yellow or white or the like may be added.

A sealing film 48 covers a plurality of light-emitting elements 46. Thus, the light-emitting elements 46 are blocked from moisture. The sealing film 48 may include an inorganic film, such as SiN or SiOx, and may be a single film or have a stack structure. For example, the sealing film 48 may have a structure in which an organic film formed of resin such as acrylic is vertically inserted into a pair of inorganic films. A filling layer 54 is provided on the sealing film 48, and the second substrate 11 is provided on the filling layer 54. For example, a substrate having a touch panel function or a circular polarization function may be used as the second substrate 11. The second substrate 11 may be omitted.

In the first embodiment, an adjustment layer 60 is provided under the pixel electrode 36, and a reflective layer 50 is provided under the adjustment layer 60. The adjustment layer 60 is a layer which adjusts an optical path length between the reflective layer 50 and the emission layer 70, and is formed of an insulating resist material or the like. The reflective layer 50 is a layer which reflects light emitted from the emission layer 70 to the outside, and is formed of a metal material such as aluminum or silver. Each layer stacked between the emission layer 70 and the reflective layer 50 such as the pixel electrode 36 and the adjustment layer 60 may have light transmittance.

Figure 9:
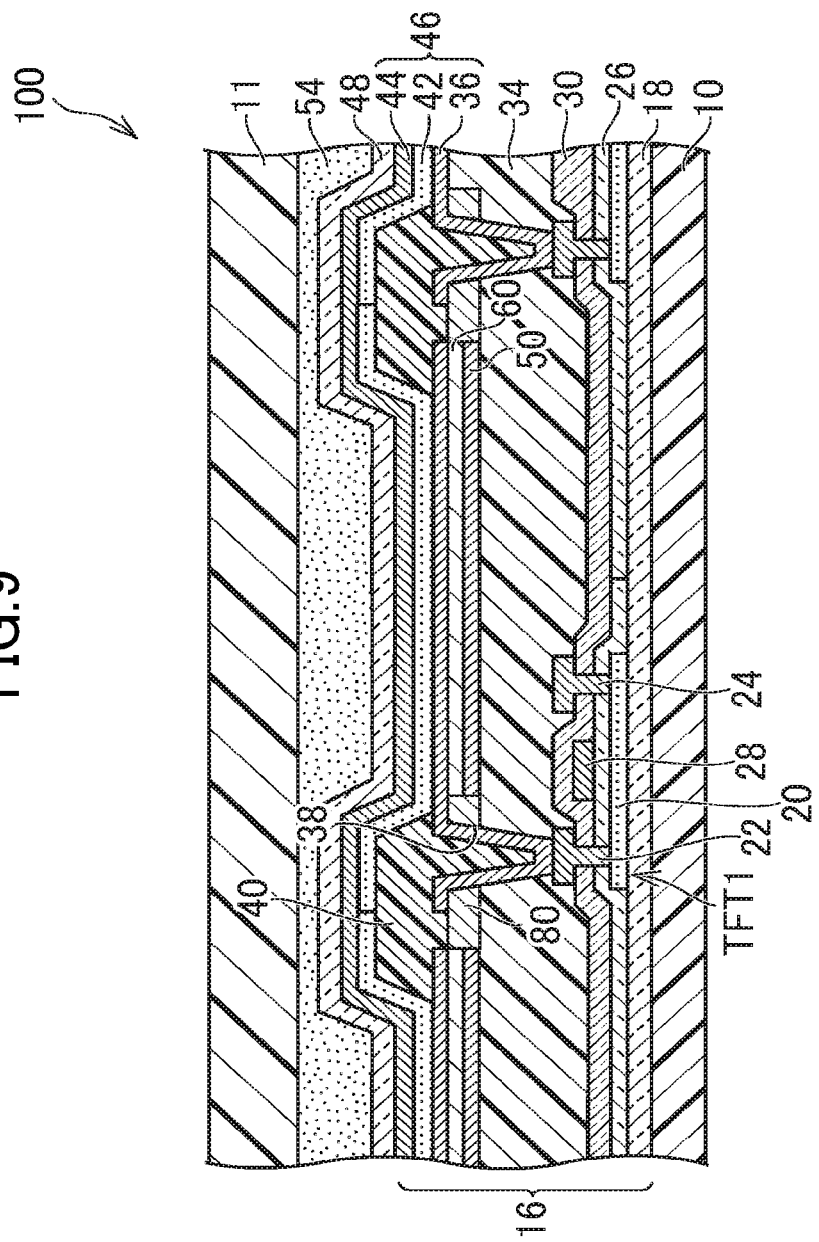
FIG. 9 is a cross-sectional view of a display device according to a modified example of the first embodiment.
Figure 10:
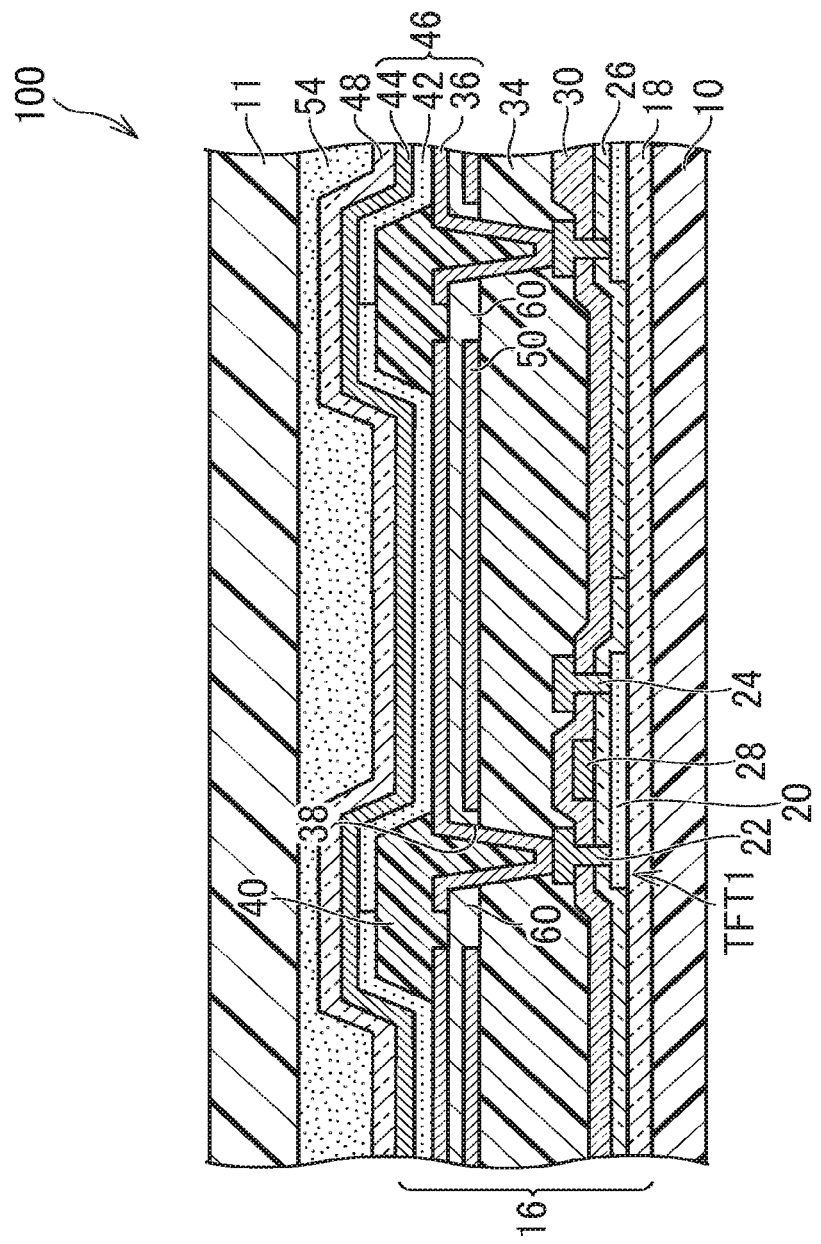
FIG. 10 is a cross-sectional view of a display device according to a modified example of the first embodiment.
Figure 11:
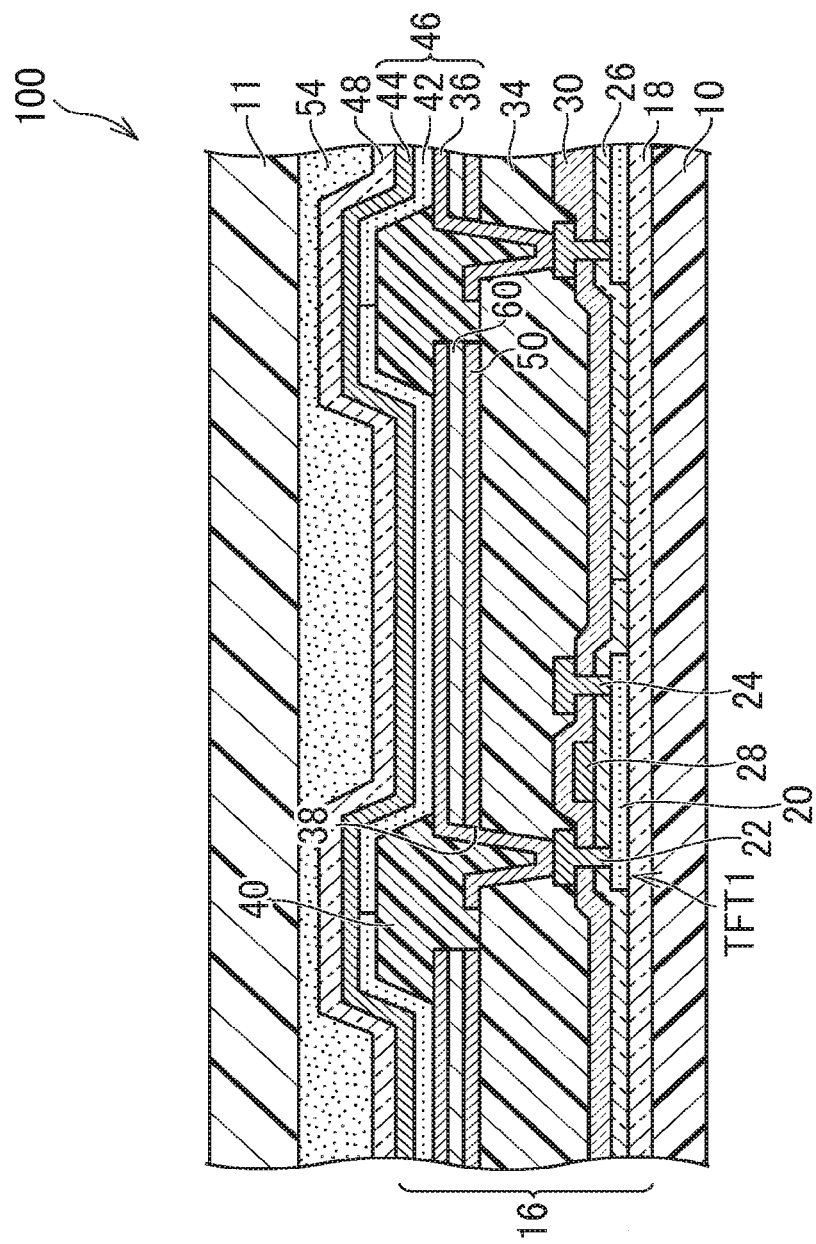
FIG. 11 is a cross-sectional view of a display device according to a modified example of the first embodiment.

In FIG. 2, the pixel electrode 36, the reflective layer 50, and the adjustment layer 60 are provided for each pixel. The planarization layer 34 may be provided in between the pixel electrode 36, the reflective layer 50, and the adjustment layer 60 as illustrated in FIG. 2. Alternatively, as illustrated in FIG. 9, an organic layer 80 which is different from the planarization layer 34 may be provided between the pixel electrode 36, the reflective layer 50, and the adjustment layer 60. The organic layer 80 may include a layer containing the same material as the adjustment layer 60. Although not illustrated, a layer formed of the same material as the planarization layer 34 may be formed between the pixel electrode 36, the reflective layer 50, and the adjustment layer 60. Alternatively, the adjustment layer 60 may be provided on the reflective layer 50 and the planarization layer 34 as illustrated in FIG. 10. Alternatively, as illustrated in FIG. 11, the insulating layer 40 may be formed on the planarization layer 34 such that end parts of the pixel electrode 36, the reflective layer 50, and the adjustment layer 60 are in contact with the insulating layer 40 without having another layer therebetween.

A color resist corresponding to a color of light emitted from each of the pixel regions P may be used as the adjustment layer 60. In detail, for example, a red color resist is preferably used for a red pixel region PR. Accordingly, color purity can be improved.

Figure 3:
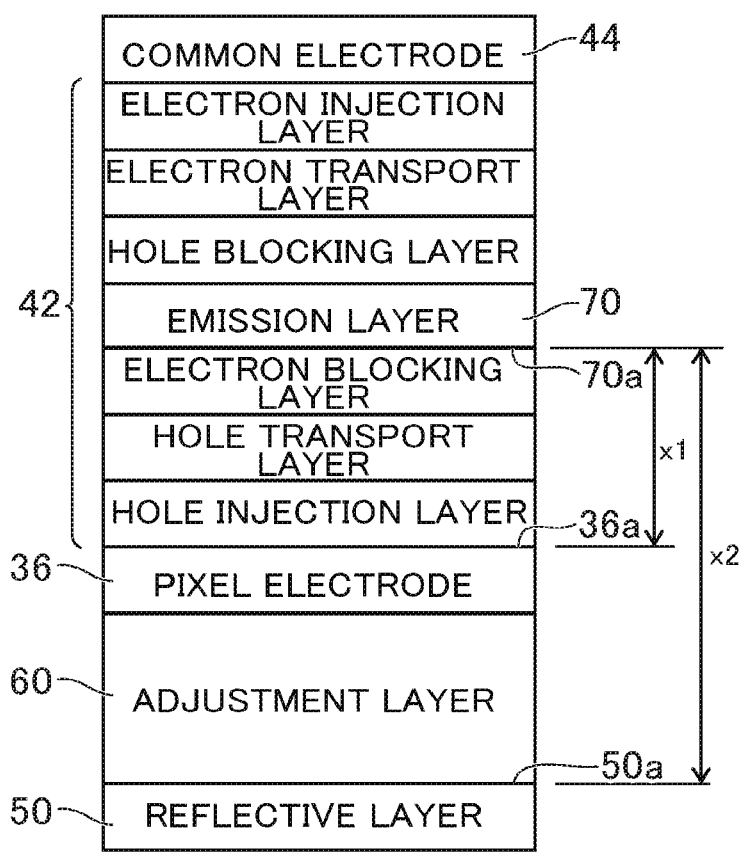
FIG. 3 is a diagram illustrating an organic electroluminescence layer and a stack structure adjacent thereto, according to the first embodiment.
Figure 4:
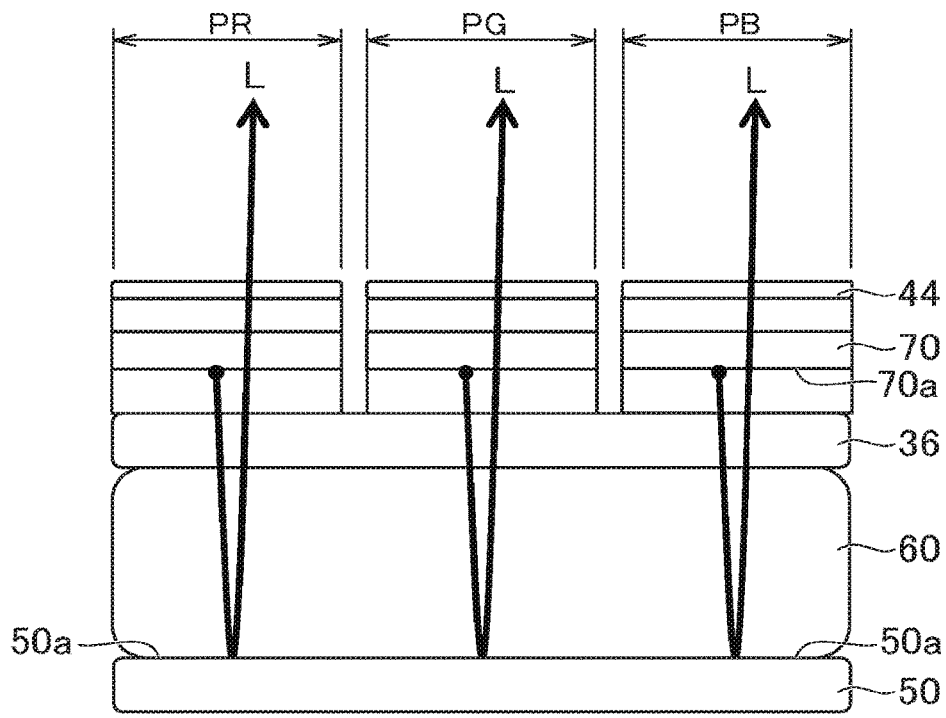
FIG. 4 is a diagram for describing reflection of light by a reflective layer according to the first embodiment.

FIG. 3 is a diagram illustrating an organic electroluminescence layer and a stack structure adjacent thereto, according to the first embodiment. FIG. 4 is a diagram for describing reflection of light by a reflective layer according to the first embodiment. In the following description, a surface facing the reflective layer 50 among surfaces of the emission layer 70 will be referred to as a light-emitting surface 70a, and a surface facing the emission layer 70 among surfaces of the reflective layer 50 will be referred to as a reflective surface 50a.

As described above, in the first embodiment, the reflective layer 50, the adjustment layer 60, the pixel electrode 36, the organic electroluminescence layer 42, and the common electrode 44 are sequentially stacked. Furthermore, in the first embodiment, as illustrated in FIG. 3, the organic electroluminescence layer 42 includes the hole injection layer, the hole transport layer, the electron blocking layer, the emission layer 70, the hole blocking layer, the electron transport layer, and the electron injection layer which are sequentially stacked. The layers constituting the organic electroluminescence layer 42 are vapor deposition layers formed by vapor deposition.

Here, the principle of light emission in the organic electroluminescence layer 42 will be explained. When a voltage is applied to the pixel electrode 36 and the common electrode 44, holes having positive charges are generated and flow to the emission layer 70 via the hole transport layer, and thus, electrons having negative charges are generated and flow to the emission layer 70 via the electron transport layer. Since the hole blocking layer is provided on the emission layer 70, the holes flowing from the pixel electrode 36 to the emission layer 70 do not move to the common electrode 44 from the emission layer 70. Since the electron blocking layer is provided under the emission layer 70, the electrons flowing from the common electrode 44 to the emission layer 70 do not move to the pixel electrode 36 from the emission layer 70. The electrons and the holes are combined together in the emission layer 70, and surrounding molecules are excited by energy generated by the combining of the electrons and the holes. Then, the molecules which are in an excited state return to a ground state. Here, the energy is discharged and thus light is emitted from the emission layer 70.

A part of the light emitted from the emission layer 70 is propagated toward the common electrode 44 and is then discharged to the outside. On the other hand, the other part of the light emitted from the emission layer 70 is propagated toward the pixel electrode 36, passes through the pixel electrode 36 and the adjustment layer 60 which have light transmittance, and then is emitted to the reflective layer 50. As illustrated in FIG. 4, light L emitted to the reflective layer 50 is reflected from the reflective surface 50a, and discharged to the outside.

In the first embodiment, as illustrated in FIG. 3, a length x1 between the light-emitting surface 70a of the emission layer 70 and a surface 36a of the pixel electrode 36 facing the emission layer 70 is set to 50 nm or less. That is, in the first embodiment, the sum of the thicknesses of the hole injection layer, the hole transport layer, and the electron blocking layer is set to 50 nm or less. As the length between the emission layer 70 and the pixel electrode 36 becomes shorter, a driving voltage of the light-emitting element 46 may decrease.

In the first embodiment, a shortest optical path length x2 between the light-emitting surface 70a of the emission layer 70 and the reflective surface 50a of the reflective layer 50 is set to 2 μm or more. In the first embodiment, the optical path length x2 is set to be longer than a wavelength of each color, thereby preventing optical interference from being generated. The length x1 is an actual physical length, whereas the optical path length x2 is an optical length when a refractive index of each layer is taken into account.

The optical path length x2 is not limited to 2 μm or more, and may be longer than at least three times of a shortest wavelength of a color among the plurality of colors of emitted light. Optical interference hardly occurs in at least a pixel region P emitting the light of the color having the shortest wavelength when the optical path length x2 is longer than three times of the shortest wavelength of the color. More preferably, the optical path length x2 is longer than three times of a longest wavelength of a color among the plurality of the colors of the emitted light. When the optical path length x2 is longer than three times of the longest wavelength, optical interference hardly occurs in any of the pixel regions P.

In the first embodiment, the color of the shortest wavelength is blue and the wavelength thereof is about 440 nm to 470 nm. A color of a second shortest wavelength is green and the wavelength thereof is about 510 nm to 550 nm. The color of the longest wavelength is red and the wavelength thereof is about 610 nm to 650 nm.

In the first embodiment, the length x1 and the optical path length x2 are set to be the same values in each of the pixel regions P. That is, as illustrated in FIGS. 3 and 4, the length x1 and the optical path length x2 are set to be the same values in the red pixel region PR, a green pixel region PG, and a blue pixel region PB. Specifically, the thicknesses of the electron blocking layer, the hole transport layer, the hole injection layer, and the adjustment layer 60 are the same in each of the pixel regions P.

As described above, in the first embodiment, the optical path length x2 from the emission layer 70 to the reflective layer 50 is adjusted by forming the adjustment layer 60. Accordingly, the electron blocking layer, the hole transport layer, and the hole injection layer may be formed in thin films, and optical interference may be prevented. Although FIG. 4 illustrates a structure in which the organic electroluminescence layer 42 is separately formed between the pixel regions P, the structure is not limited thereto and the electron blocking layer, the hole transport layer, and the hole injection layer may be common vapor deposition layers formed extending between the pixel regions P. In this case, it is not necessary to separately vapor deposit the vapor deposition layers for each pixel region P. Alternatively, at least the emission layer 70 among the vapor deposition layers constituting the organic electroluminescence layer 42 may be separately vapor deposited for each pixel region P. As a separate vapor deposition process is reduced, an increase in the number of manufacturing processes may be prevented and the yield may be improved, thereby reducing manufacturing costs. In addition, a vapor deposition time may decrease and thus manufacturing costs may be reduced.

Figure 5:
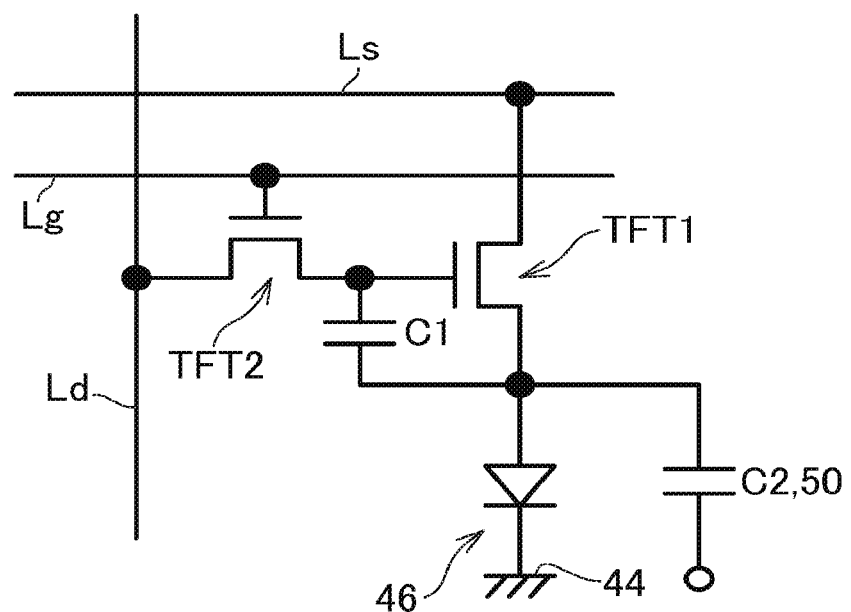
FIG. 5 is a circuit diagram of an example of a pixel circuit.

The reflective layer 50 described above in the first embodiment may have at least a function of reflecting light emitted from the emission layer 70, and may function as a capacitor when electrically connected to another layer. FIG. 5 is a circuit diagram illustrating an example of a pixel circuit. FIG. 5 illustrates an example in which the reflective layer 50 is electrically connected to the pixel electrode 36. The circuit diagram illustrated in FIG. 5 will be described below.

The pixel circuit of the display device 100 includes the driving transistor TFT1 and the light-emitting element 46 described above with reference to FIG. 2. The pixel circuit of the display device 100 further includes a storage capacitor C1 which maintains a potential difference between a gate of the driving transistor TFT1 and an electrode of the driving transistor TFT1 facing the light-emitting element 46. As illustrated in FIG. 5, an electrode of the driving transistor TFT1 opposite to the light-emitting element 46 is connected to a power supply line Ls. The pixel circuit of the display device 100 further includes a switching transistor TFT2, and a gate of the switching transistor TFT2 is connected to a scan line Lg, one of a source and a drain of the switching transistor TFT2 is connected to an image signal line Ld, and the other source or drain is connected to the gate of the driving transistor TFT1. The pixel electrode 36 of the light-emitting element 46 is electrically connected to the reflective layer 50 to form a storage capacitor C2. The storage capacitor C2 functions as a capacitor assisting the storage capacitor C1. By forming the storage capacitor C2, unintended parasitic capacitance may be prevented from being generated.

Figure 6:
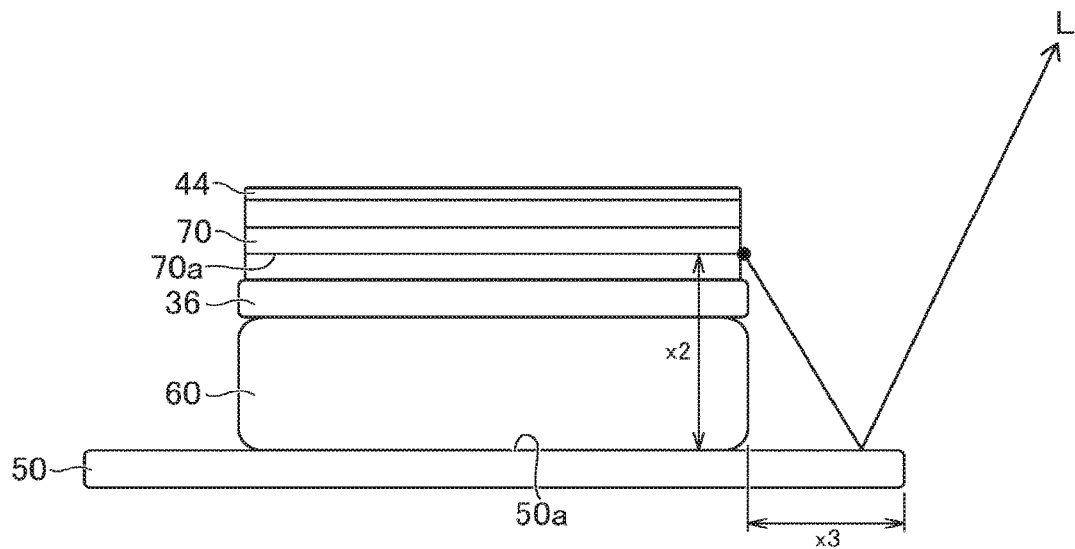
FIG. 6 is a schematic diagram for describing a reflective layer according to a modified example of the first embodiment.
Figure 7:
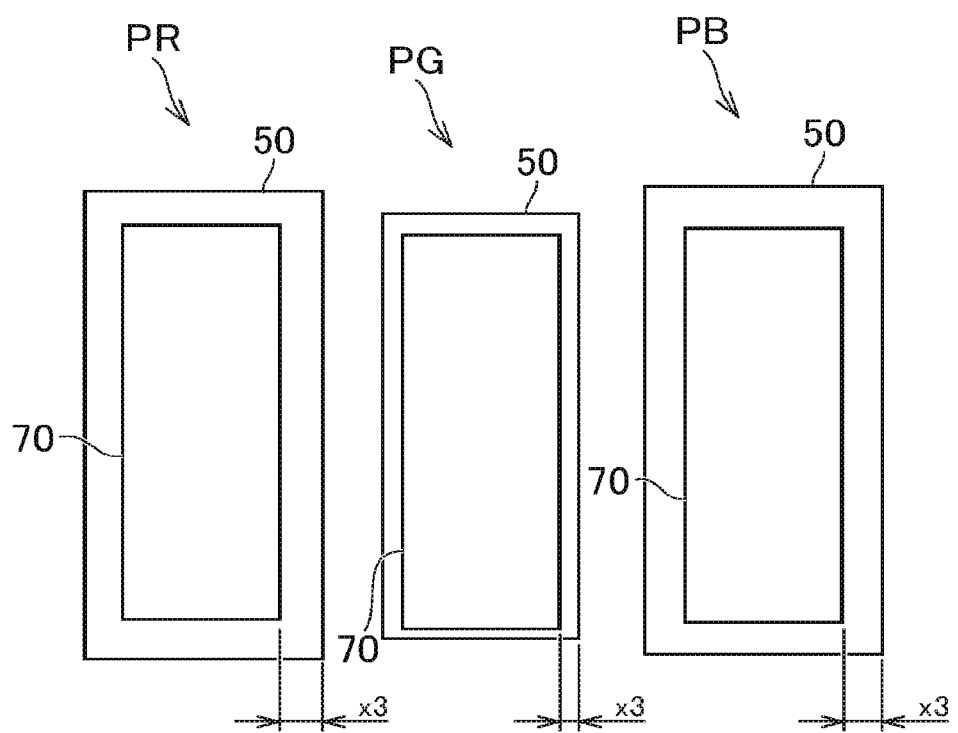
FIG. 7 is a schematic plan view of the reflective layer according to the modified example of the first embodiment.

A modified example of the first embodiment will be described with reference to FIGS. 6 and 7 below. FIG. 6 is a schematic diagram for describing a reflective layer according to a modified example of the first embodiment. FIG. 7 is a schematic plan view of the reflective layer according to the modified example of the first embodiment.

Light emitted to the reflective layer 50 includes light obliquely incident on the reflective surface 50a of the reflective layer 50. In a modified example, in one pixel region P, a width of the reflective layer 50 is greater than that of a light-emitting part. That is, the reflective layer 50 includes a region which overlaps the light emitting part and a region which does not overlap the light emitting part, when viewed from the plan view illustrated in FIG. 7. Thus, as illustrated in FIG. 6, the light emitted obliquely from the light-emitting surface 70a of the emission layer 70 is also reflected from the reflective layer 50. For example, in order to reflect light emitted at a gradient of 30° with respect to the light-emitting surface 70a, a width x3 of the region which does not overlap the reflective layer 50 is preferably set to 1/√3 or more of a length from the light-emitting part to the reflective layer 50.

Furthermore, visual characteristics of each of the pixel regions P emitting light of different colors may be adjusted by changing a width of the region of the reflective layer 50 which does not overlap the light-emitting part. FIG. 7 illustrates an example in which a width x3 of a region of the reflective layer 50 which does not overlap a light-emitting part in a green pixel region PG is less than a width x3 of a region of the reflective layer 50 which does not overlap a light-emitting part in each of a red pixel region PR and a blue pixel region PB.

FIGS. 6 and 7 illustrate examples in which the width of the reflective layer 50 is greater than the width of the light-emitting part, but the width of the reflective layer 50 may be greater than at least that of a light-emitting region of the light-emitting part.

Figure 8:
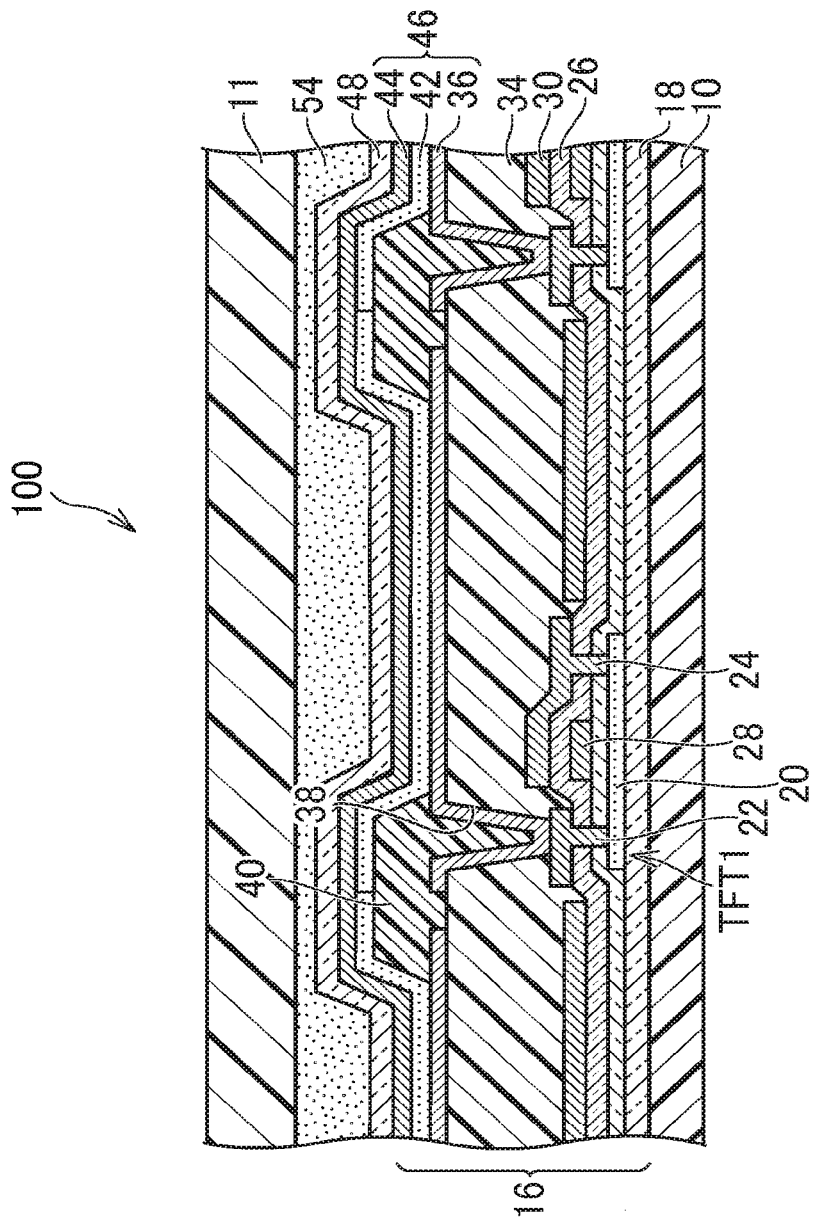
FIG. 8 is a cross-sectional view of a display device according to a second embodiment.

A second embodiment will be described with reference to FIG. 8 below. FIG. 8 is a cross-sectional view of a display device according to the second embodiment. The same reference numerals are assigned to the same components as those of the first embodiment described above with reference to FIG. 2, and are not redundantly described here.

In the second embodiment, a reflective layer 50 is not provided, unlike in the first embodiment. A source electrode 22 and a drain electrode 24 of a driving transistor TFT1 have a function of reflecting light emitted from an emission layer 70, instead of the reflective layer 50. The source electrode 22 and the drain electrode 24 are preferably formed of, for example, a metal material such as aluminum and silver.

Furthermore, an adjustment layer 60 is not provided, unlike in the first embodiment. An optical path length from the emission layer 70 to the source electrode 22 and the drain electrode 24 having a reflection function is adjusted by a planarization layer 34. In this case, a shortest optical path length x2 between a light-emitting surface 70a of the emission layer 70 and reflective surfaces of the source electrode 22 and the drain electrode 24 may be set to 2 μm or more.

Examples in which an organic electroluminescence display device (an organic light-emitting diode (OLED)) is used as the display device 100 have been described in the above-described embodiments, but the display device 100 is not limited thereto and may be a quantum dot display device (quantum dot light-emitting diode (QLED)).

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device comprising:
   an organic electroluminescence layer including a plurality of emission layers respectively emitting light of a plurality of colors; and
   a reflective layer configured to reflect the light emitted from the emission layers, wherein
   a shortest optical path length between the emission layers and the reflective layer is longer than at least three times of a shortest wavelength of a color among the plurality of colors of the emitted light.

2. The display device according to claim 1, wherein the optical path length is longer than three times of a longest wavelength of a color among the colors of the emitted light.

3. The display device according to claim 1, wherein the optical path length is 2 μm or more.

4. The display device according to claim 1, wherein an adjustment layer is provided between the organic electroluminescence layer and the reflective layer.

5. The display device according to claim 2, wherein the color having the longest wavelength is red.

6. The display device according to claim 1, wherein the color having the shortest wavelength is blue.

7. The display device according to claim 1, further comprising a common electrode and a pixel electrode while the organic electroluminescence layer is sandwiched therebetween, wherein
   the pixel electrode has light transmittance, and
   the light emitted from the emission layers is transmitted through the pixel electrode, and emitted to the reflective layer.

8. The display device according to claim 7, wherein a length from the emission layers to the pixel electrode is 50 nm or less.

9. The display device according to claim 7, wherein a length from the emission layers to the pixel electrode is the same in the emission layers each emitting the light of the plurality of colors.

10. The display device according to claim 7, wherein the organic electroluminescence layer includes common vapor deposition layers among the plurality of emission layers stacked between the common electrode and the pixel electrode.

11. The display device according to claim 10, wherein the vapor deposition layers include an electron blocking layer, a hole transport layer, and a hole injecting layer.

12. The display device according to claim 1, wherein the reflective layer includes a region which overlaps light-emitting parts of the emission layers and a region which does not overlap the light-emitting parts of the emission layers, when viewed from a plan view.

13. The display device according to claim 12, wherein a width of the non-overlapping region of the reflective layer is 1/√3 times or more of a length from the emission layers to the reflective layer.

14. The display device according to claim 4, further comprising:
- a driving transistor; and
- a planarization layer provided on the driving transistor, wherein
- the reflective layer is a source electrode and a drain electrode constituting the driving transistor, and
- the adjustment layer is the planarization layer.

15. The display device according to claim 2, wherein the optical path length is 2 μm or more.

16. The display device according to claim 15, wherein the color having the longest wavelength is red.

* * * * *